United States Patent
Tsubokura et al.

(10) Patent No.: US 7,271,427 B2
(45) Date of Patent: Sep. 18, 2007

(54) LIQUID CRYSTAL DISPLAY DEVICE, ILLUMINATION DEVICE BACKLIGHT UNIT

(75) Inventors: Masaki Tsubokura, Mobara (JP); Kazuhiko Yanagawa, Mobara (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 193 days.

(21) Appl. No.: 11/217,297

(22) Filed: Sep. 2, 2005

(65) Prior Publication Data

US 2006/0043406 A1    Mar. 2, 2006

(30) Foreign Application Priority Data

Sep. 2, 2004    (JP) .............................. 2004-255936

(51) Int. Cl.
*H01L 29/22*    (2006.01)
(52) U.S. Cl. ........................ 257/99; 257/89; 257/773
(58) Field of Classification Search .................. 257/99, 257/91, 89, 40, 529, 773
See application file for complete search history.

(56) References Cited

U.S. PATENT DOCUMENTS

2006/0043406 A1*    3/2006    Tsubokura et al. ............ 257/99

FOREIGN PATENT DOCUMENTS

| JP | 2001-210467 | 8/2001 |
|---|---|---|
| JP | 2003-121839 | 4/2003 |

\* cited by examiner

*Primary Examiner*—Mark V. Prenty
(74) *Attorney, Agent, or Firm*—Antonelli, Terry, Stout & Kraus, LLP.

(57) ABSTRACT

A liquid crystal display device with a liquid crystal display panel and a backlight, the backlight is formed by stacking a lower electrode, a light emitting layer and an upper layer on one surface of a substrate, one of the lower electrode and the upper electrode have planer pattern, another of the lower electrode and the upper electrode have plurality of large regions and plurality of small regions which connect neighboring two of the plurality of large regions, and width of the small regions is narrower than that of the large regions.

30 Claims, 9 Drawing Sheets

LIQUID CRYSTAL DISPLAY DEVICE, ILLUMINATION DEVICE BACKLIGHT UNIT

BACKGROUND OF THE INVENTION

1. Field of the Invention

The present invention relates to a liquid crystal display device and an illumination device, and more particularly to a liquid crystal display device which uses a backlight as an illumination device.

2. Description of the Related Art

The liquid crystal display device is configured such that respective pixels of a liquid crystal display panel change light transmitting quantities in response to the behavior of liquid crystal.

In this manner, in the liquid crystal display panel, the pixel per se does not emit light and hence, the liquid crystal display panel is usually provided with a backlight which functions as a surface light source on a back surface thereof, for example.

Further, there has been known a liquid crystal display panel in which a backlight uses, for example, light emitting layers such as organic EL layers as light emitting sources.

That is, on a portion which is allowed to function as a light source surface on a substrate, a lower electrode, the light emitting layer and an upper electrode are stacked, and a potential difference is generated between the lower electrode and the upper electrode so as to generate an electric current in the inside of a light emitting layer, whereby the light emitting layer emits light.

Further, the light emitting layers are arranged in plane such that the respective layers which emit lights of red (R), green (G) and blue (B) are arranged close to each other, and the lights of respective colors which are emitted from the light emitting layers are mixed to form a white light.

Such a technique is disclosed in Japanese Patent Laid-open 2001-210467 and Japanese Laid-open 2003-121839.

SUMMARY OF THE INVENTION

However, a backlight disclosed in Japanese Patent Laid-open 2001-210467 is configured such that the lower electrode and the upper electrode are respectively formed in common and hence, the backlight includes the respective electrodes which are brought into contact with whole regions of the light emitting layers.

Accordingly, when a pin hole is generated in the light emitting layer, for example, and the lower electrode and the upper electrode are short-circuited through the pin hole, there exists a large possibility that defective light emission takes place over the whole region of light emitting layer.

Further, in a backlight disclosed in Japanese Laid-open 2003-121839, the lower electrode is constituted of a group formed of a plurality of electrodes which extend in the x direction and are arranged in parallel in the y direction, while the upper electrode is constituted of a group formed of a plurality of electrodes which extend in the y direction and are arranged in parallel in the x direction. An electric current flows in the light emitting layer at a portion which is sandwiched between the lower electrode and the upper electrode and the portion emits light.

However, even with such a constitution, it is unavoidable that the light emitting layer which is positioned above or below the respective electrodes which extend in the x direction and in the y direction including the portion of the light emitting layer where the pin hole is formed suffers from the defective light emission.

The present invention has been made under such circumstances and it is one advantage of the present invention to provide a liquid crystal display device which includes a backlight which can suppress the defective light emission at minimum even when short-circuiting arises in each electrode.

Further, it is another advantage of the present invention to provide an illumination device which can suppress the defective light emission at minimum even when short-circuiting arises in each electrode.

To briefly explain the summary of typical inventions among the inventions described in this specification, they are as follows.

(1)

A liquid crystal display device according to the present invention includes, for example, at least a liquid crystal display panel and a backlight, wherein the backlight is formed by stacking a lower electrode, a light emitting layer and an upper layer on one surface of a substrate, at least one of the lower electrode and the upper electrode defines a pattern which is formed on respective partitioned regions which are formed by dividing a region on the substrate into a plurality of spaced-apart and divided partitioned regions and connecting regions which connect each partitioned region and the neighboring other partitioned regions which are arranged close to each partitioned region, and a width of the electrode on the connecting regions is set smaller than a length of one side or a diameter of the electrode on the partitioned region.

(2)

A liquid crystal display device according to the present invention is, for example, on the premise of the constitution (1), characterized in that another electrode out of the lower electrode and the upper electrode defines a planar pattern which is overlapped to one electrode.

(3)

A liquid crystal display device according to the present invention is, for example, on the premise of the constitution (1), characterized in that the light emitting layer per se exhibits a white light and is formed also on regions other than the respective partitioned regions and the connecting regions.

(4)

A liquid crystal display device according to the present invention is, for example, on the premise of the constitution (1), characterized in that the light emitting layer is formed by arranging respective layers which respectively exhibit red, green and blue close to each other and are formed in at least the respective partitioned regions.

(5)

An illumination device according to the present invention is, for example, characterized in that the illumination device is formed by stacking a lower electrode, a light emitting layer and an upper layer on one surface of the substrate, at least one of the lower electrode and the upper electrode is formed on respective partitioned regions which are formed by dividing a region on the substrate into a plurality of spaced-apart and divided partitioned regions and connecting regions which connect each partitioned region and the neighboring other partitioned regions which are arranged close to each partitioned region, and a width of the electrode on the connecting regions is set smaller than a length of one side or a diameter of the electrode on the partitioned region.

(6)

An illumination device according to the present invention is, for example, on the premise of the constitution (5), characterized in that another electrode out of the lower electrode and the upper electrode defines a planar pattern which is overlapped to one electrode.

(7)

An illumination device according to the present invention is, for example, on the premise of the constitution (5), characterized in that the light emitting layer per se exhibits a white light and is formed also on regions other than the respective partitioned regions and the connecting regions.

(8)

An illumination device according to the present invention is, for example, on the premise of the constitution (5), characterized in that the light emitting layer is formed by arranging respective layers which respectively exhibit red, green and blue close to each other and are formed in at least the respective partitioned regions.

(9)

A liquid crystal display device according to the present invention includes, for example, a liquid crystal display panel and a backlight, the backlight is formed by stacking a lower electrode, a light emitting layer and an upper layer on one surface of a substrate, one of the lower electrode and the upper electrode have planer pattern, another of the lower electrode and the upper electrode have plurality of large regions and plurality of small regions which connect neighboring two of the plurality of large regions, and width of the small regions is narrower than that of the large regions.

(10)

A liquid crystal display device according to the present invention is, for example, on the premise of the constitution (9), characterized in that both the plurality of large regions and the plurality of small regions are overlapped to the one the lower electrode and the upper electrode.

(11)

A liquid crystal display device according to the present invention is, for example, on the premise of the constitution (10), characterized in that the light emitting layer per se exhibits a white light and formed at the large regions, the small regions, and region between the large regions.

(12)

A liquid crystal display device according to the present invention is, for example, on the premise of the constitution (10), characterized in that the light emitting layer is formed by arranging respective layers which respectively exhibit red, green and blue close to each other and are formed in at least the respective large regions.

(13)

A liquid crystal display device according to the present invention is, for example, on the premise of the constitution (10), characterized in that the small region have bar shape.

(14)

A liquid crystal display device according to the present invention is, for example, on the premise of the constitution (13), characterized in that the large region have square shape.

(15)

A liquid crystal display device according to the present invention is, for example, on the premise of the constitution (13), characterized in that the large region have hexagonal shape.

(16)

A liquid crystal display device according to the present invention is, for example, on the premise of the constitution (14), characterized in that the small region are arranged at plurality side of the large region.

(17)

A liquid crystal display device according to the present invention is, for example, on the premise of the constitution (15), characterized in that the small region are arranged at plurality side of the large region.

(18)

A liquid crystal display device according to the present invention is, for example, on the premise of the constitution (13), characterized in that the large region have first large region and plurality of second large region which arranged around the first large region.

(19)

A liquid crystal display device according to the present invention is, for example, on the premise of the constitution (13), characterized in that the one of the lower electrode and the upper electrode have slit arranged to cross the small region.

(20)

An illumination device according to the present invention is, for example, characterized in that the illumination device is formed by stacking a lower electrode, a light emitting layer and an upper layer on one surface of a substrate, one of the lower electrode and the upper electrode have planer pattern, another of the lower electrode and the upper electrode have plurality of large regions and plurality of small regions which connect neighboring two of the plurality of large regions, and width of the small regions is narrower than that of the large regions.

(21)

An illumination device according to the present invention is, for example, on the premise of the constitution (20), characterized in that both the plurality of large regions and the plurality of small regions are overlapped to the one the lower electrode and the upper electrode.

(22)

An illumination device according to the present invention is, for example, on the premise of the constitution (20), characterized in that the light emitting layer per se exhibits a white light and formed at the large regions, the small regions, and region between the large regions.

(23)

An illumination device according to the present invention is, for example, on the premise of the constitution (20), characterized in that the light emitting layer is formed by arranging respective layers which respectively exhibit red, green and blue close to each other and are formed in at least the respective large regions.

(24)

An illumination device according to the present invention is, for example, on the premise of the constitution (20), characterized in that the small region have bar shape.

(25)

An illumination device according to the present invention is, for example, on the premise of the constitution (24), characterized in that the large region have square shape.

(26)

An illumination device according to the present invention is, for example, on the premise of the constitution (24), characterized in that the large region have hexagonal shape.

(27)

An illumination device according to the present invention is, for example, on the premise of the constitution (25), characterized in that the small region are arranged at plurality side of the large region.

(28)

An illumination device according to the present invention is, for example, on the premise of the constitution (26), characterized in that the small region are arranged at plurality side of the large region.

(29)

An illumination device according to the present invention is, for example, on the premise of the constitution (24), characterized in that the large region have first large region and plurality of second large region which arranged around the first large region.

(30)

An illumination device according to the present invention is, for example, on the premise of the constitution (24), characterized in that the one of the lower electrode and the upper electrode have slit arranged to cross the small region.

The present invention is not limited to the above-mentioned constitutions and various modifications can be made without departing from the technical concept of the present invention.

DETAILED DESCRIPTION OF THE INVENTION

Hereinafter, an embodiment of a liquid crystal display device according to the present invention is explained in conjunction with attached drawings.

Figure 2:
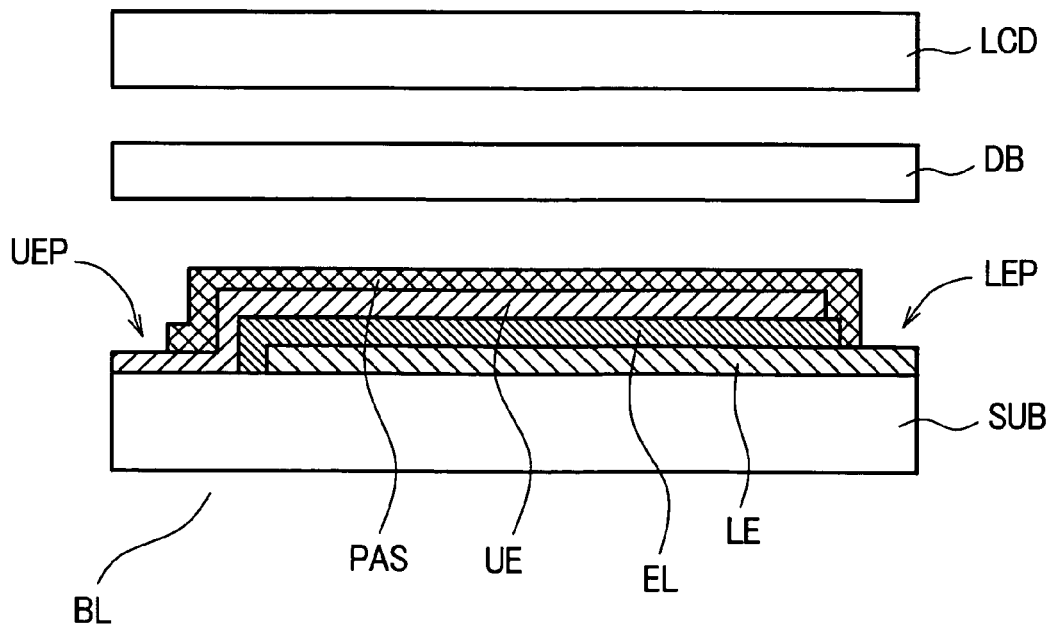
FIG. 2 is a side view with a part in cross section showing the constitution of one embodiment of a liquid crystal display device according to the present invention.

FIG. 2 is a side view with a part in cross section showing one embodiment of the liquid crystal display device according to the present invention. The liquid crystal display device shown in FIG. 2 constitutes a module by sequentially arranging a liquid crystal display panel LCD, a diffusion body DB and a backlight BL which constitutes an illumination device from a viewer's side.

The liquid crystal display panel LCD is, although not shown in the drawings, configured to form an envelop using respective substrates which are arranged with liquid crystal therebetween and includes a large number of pixels in the spreading direction of the liquid crystal. A pair of electrodes are provided to each pixel, wherein by generating an electric field through these electrodes for every pixel, a quantity of light which passes through the pixel can be controlled.

The light which passes through the liquid crystal display panel LCD is introduced from the backlight BL described later, and the light irradiated from the liquid crystal display panel LCD is, when the light passes through each pixel, added with information of the pixel.

The diffusion body DB is formed of a diffusion plate or a diffusion sheet and is configured to make the brightness of the light from the backlight BL uniform at a stage before the light from the backlight BL is incident on the liquid crystal display panel LCD.

The backlight BL forms a light source which uses, for example, an organic EL as a light emitting body and has the constitution explained hereinafter.

First of all, the backlight BL includes a substrate SUB of a size substantially equal to a size of the liquid crystal display panel LCD. On a main surface of the substrate SUB at a liquid crystal display panel LCD side, a lower electrode LE is formed over a whole area thereof. The lower electrode LE is an electrode which constitutes one of a pair of electrodes for allowing an electric current to flow in a light emitting layer EL described later.

Further, a terminal LEP which supplies a power source to the lower electrode LE is provided to a portion of a periphery of the lower electrode LE.

Further, on an area of an upper surface of the lower electrode LE except for at least the above-mentioned terminal LEP, a light emitting layer EL is formed. As a material of the light emitting layer EL, for example, an organic EL is selected. However, it is needless to say that other material can be used as the material of the light emitting layer EL.

Here, the light emitting layer EL is, although the light emitting layer EL is explained again later, configured to emit a white light when the light emitting layer EL emits light as a whole, and the white light is irradiated to the liquid crystal display panel LCD through the above-mentioned diffusion body DB.

An upper electrode UE is formed on a surface of the light emitting layer EL and the upper electrode UE is provided with a terminal UEP thereof at a portion of the periphery of the upper surface of the substrate SUB. The upper electrode UE is formed of a light transmitting conductive film made of, for example, ITO (Indium Tin Oxide) or the like. This provision is adopted to allow the light emitted from the above-mentioned light emitting layer EL to pass through the upper electrode UE and to be irradiated to the liquid crystal display panel LCD side.

Figure 1:
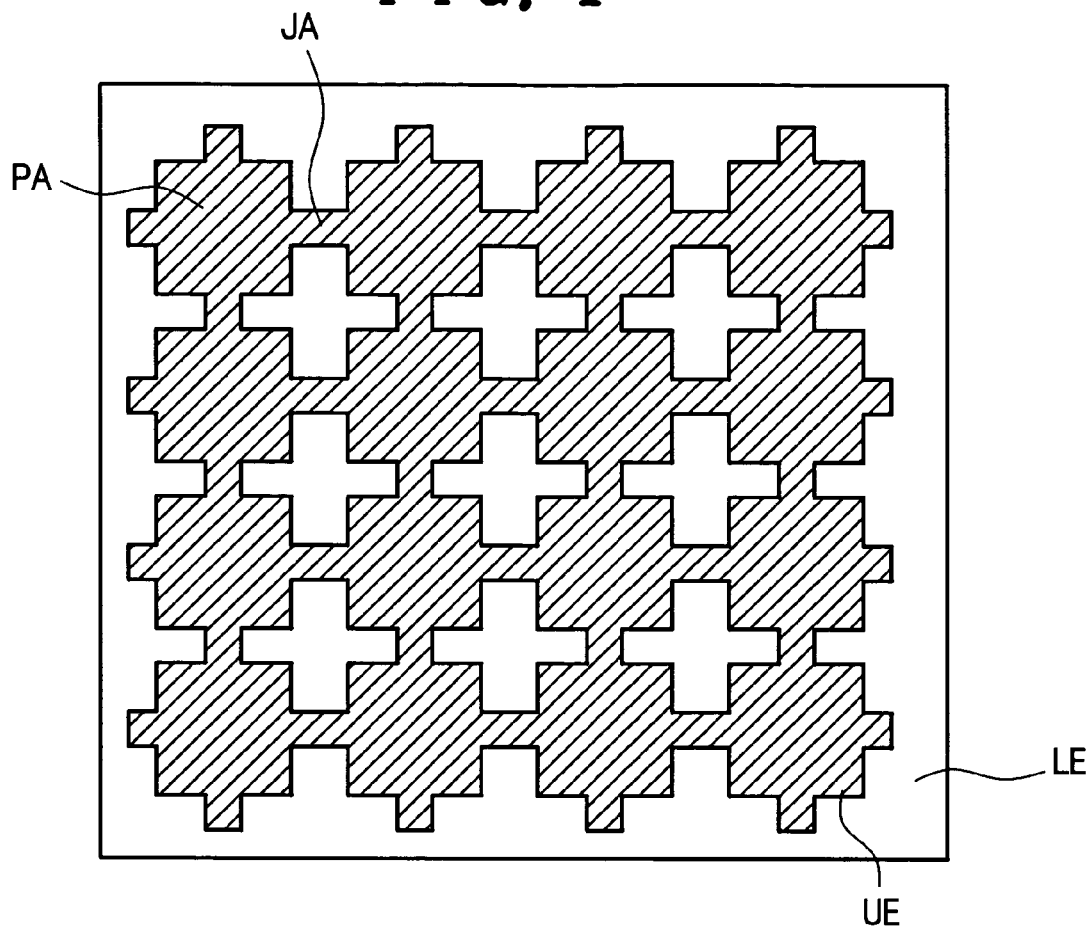
FIG. 1 is a plan view showing one embodiment of the constitution of an illumination device according to the present invention.

Here, the above-mentioned upper electrode UE on the light emitting layer EL is formed in a pattern shown in FIG. 1, for example.

First of all, the region on the upper surface of the light emitting layer EL is divided into a plurality of partitioned regions PA, and these respective partitioned regions PA are arranged in a matrix array with a slight gap between each partitioned region PA and other neighboring partitioned region PA.

All of the respective partitioned regions PA have the same size. Further, each partitioned region PA is constituted as a dedicated area having a polygonal shape (quadrangular shape in FIG. 1) whose one side is at least larger than a width of a connecting region JA described later. In other words, the size of each partitioned region PA is not specified and it is sufficient that the above-mentioned relationship is satisfied with respect to the relationship with a width of the above-mentioned connecting region JA.

Further, each partitioned region PA is connected with other neighboring partitioned regions PA which are arranged in the upward and downward directions as well as in the left and right directions by the connecting regions JA. A width of the connecting region JA is, as described above, is set to a small value compared to a length of one side of each partitioned region PA.

The upper electrode UE is formed in a pattern which covers the above-mentioned respective portioned regions PA and the connecting regions JA which connect the respective partitioned regions PA on the light emitting layer EL. Accordingly, the upper electrode UE forms a pattern which includes a plurality of respective partitioned regions PA which are divided by separation and connecting regions JA which connects these respective partitioned regions PA with other neighboring partitioned regions PA on the light emitting layer EL and, at the same time, a width of the above-mentioned connecting regions JA forms a pattern in which the width of the connecting region JA is smaller than one side of the above-mentioned partitioned region PA.

Due to such a constitution, when a power source is supplied between the upper electrode UE and the lower electrode LE through the terminals LEP, UEP respectively, the light emitting layer EL at the above-mentioned partitioned regions PA and connecting regions JA emits light and the light passes through the upper electrode UE and is irradiated.

Figure 3:
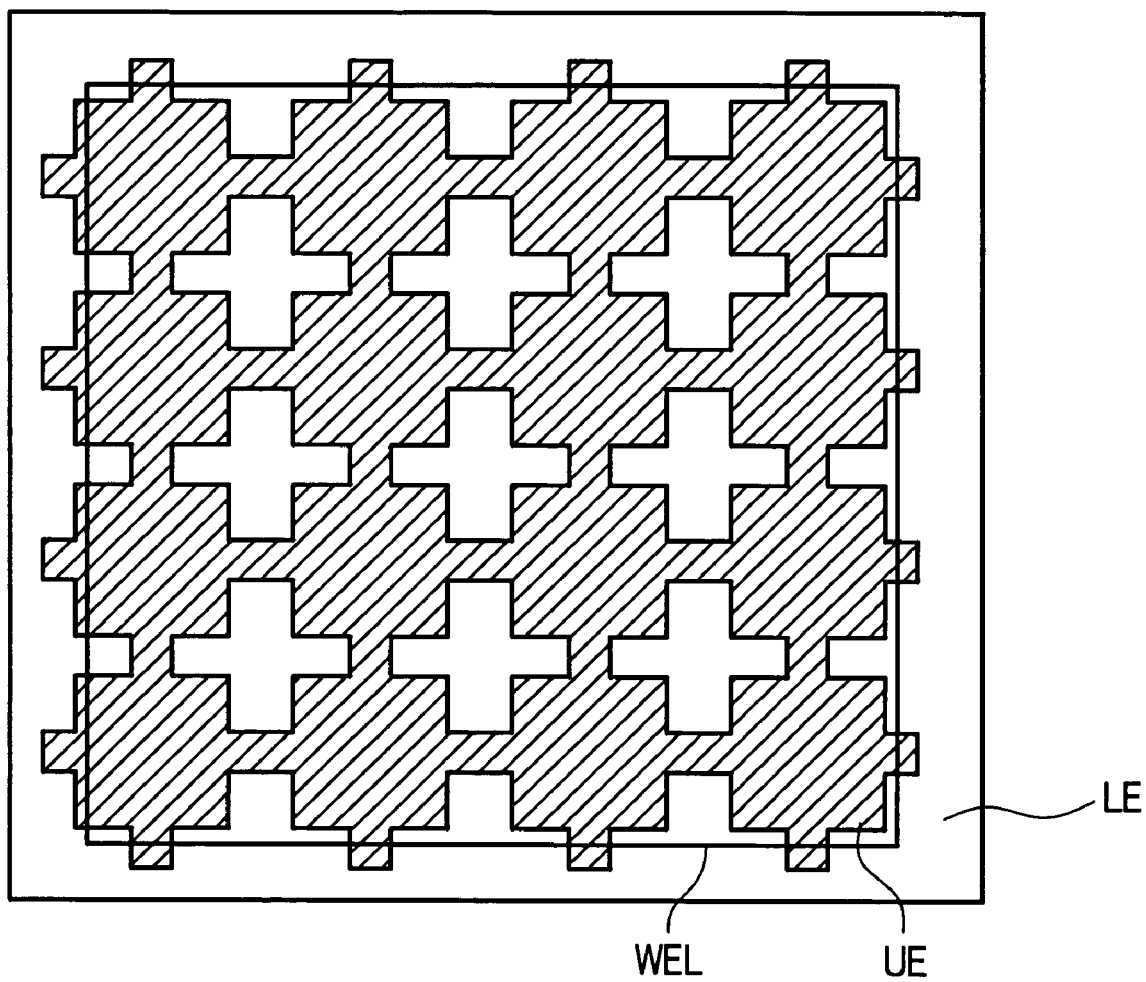
FIG. 3 is a plan view showing another embodiment of the constitution of the illumination device according to the present invention and also is a view showing the constitution of a light emitting layer.

Here, when the above-mentioned light emitting layer EL is, as shown in FIG. 3 which is depicted corresponding to FIG. 1, formed of a mixture of a light emitting material which exhibits red (R), a light emitting material which exhibits green (G) and a light emitting material which exhibits blue (B), that is, a white light emitting layer WEL, light in which these colors are mixed, that is, white light is irradiated.

In this case, it is needless to say that the present invention is not always limited to the use of the above-mentioned white light emitting layer WEL and the light emitting materials which exhibit the respective colors may be independently formed on respective neighboring portions.

Figure 4:
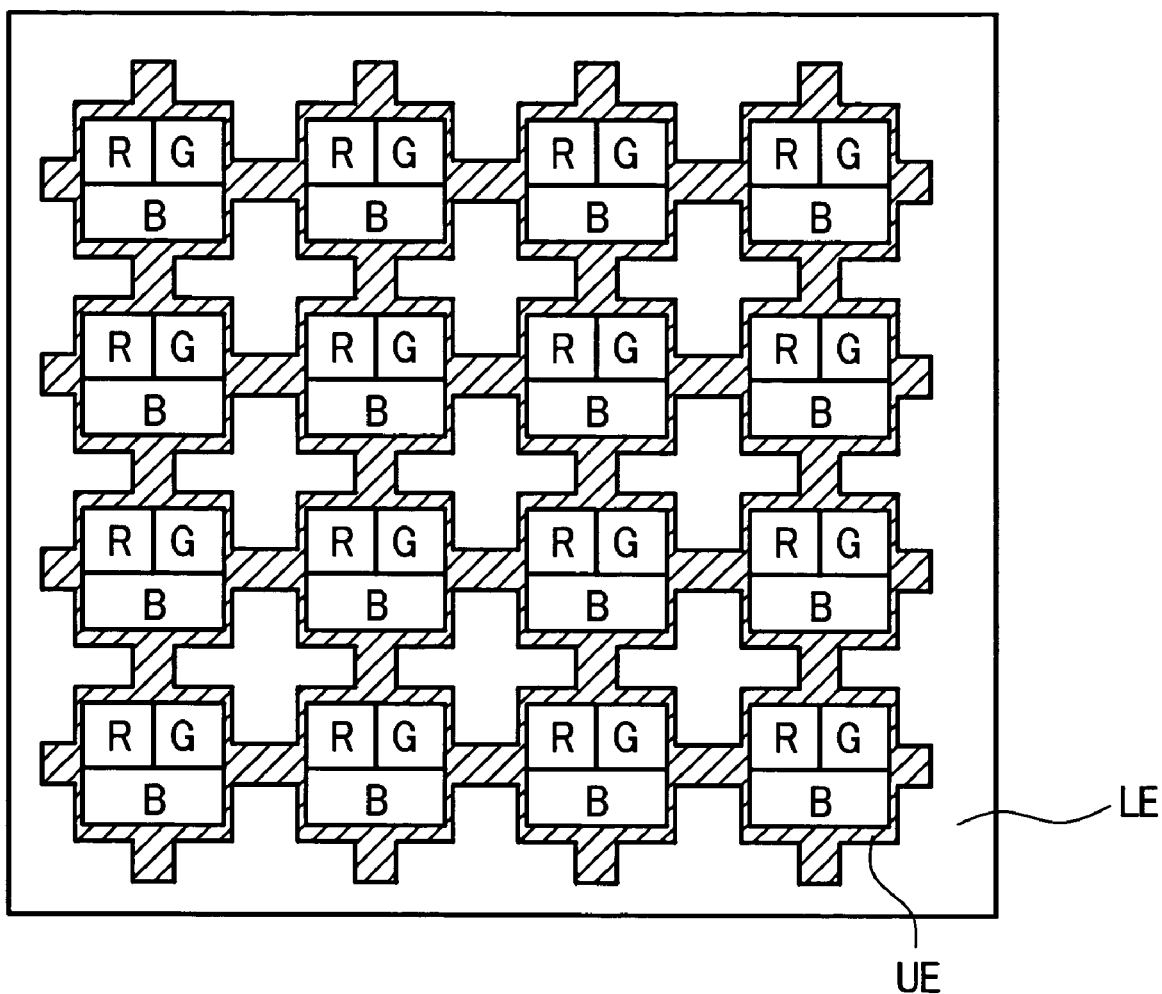
FIG. 4 is a plan view showing another embodiment of the constitution of the illumination device according to the present invention and also is a view showing the constitution of the light emitting layer.

FIG. 4 shows such a constitution and corresponds to FIG. 1. As shown in FIG. 4, in each partitioned region PA, a light emitting material which exhibits red (R), a light emitting material which exhibits green (G) and a light emitting material which exhibits blue (B) are arranged close to each other and lights having these colors are mixed after being irradiated from these light emitting materials to exhibit a white light.

In this case, in each partitioned region PA, the light emitting material which exhibits red (R), the light emitting material which exhibits green (G) and the light emitting material which exhibits blue (B) are arranged one for each color. However, it is needless to say that light emitting materials may be arranged uniformly two or three for each color. It is because that a planar size of each partitioned region PA or a planar size of each light emitting material is not specified and can be arbitrarily determined. However, it is preferable that a region defined between a profile of each partitioned region PA and an envelope of a plurality of respective light emitting materials arranged in the inside of the partitioned region PA is set as small as possible. Such setting is necessary for enhancing the light emitting efficiency.

Here, in the above-mentioned constitution, an insulation film is formed on regions other than regions where the respective light emitting materials are formed. The insulation film is provided to function as an interlayer insulation film between the lower electrode LE and the upper electrode UE.

Further, in FIG. 4, the constitution in which the light emitting layer EL is not formed in each connecting region JA is adopted. However, the present invention is not limited to such a constitution and the light emitting layer EL may be formed on each connecting region JA. However, when the light emitting layer EL is formed on each connecting region JA, it is necessary to determine the numbers of the light emitting layers EL of respective colors such that the white light is produced by mixing lights of respective colors as a whole.

Here, on the main surface of the substrate on which the upper electrode UE is formed, a moisture-proof layer PAS is formed in a state that the moisture-proof layer PAS also covers the upper electrode UE. The moisture-proof layer PAS is provided for protecting the light emitting layer EL from the moisture in the atmosphere.

Figure 5:
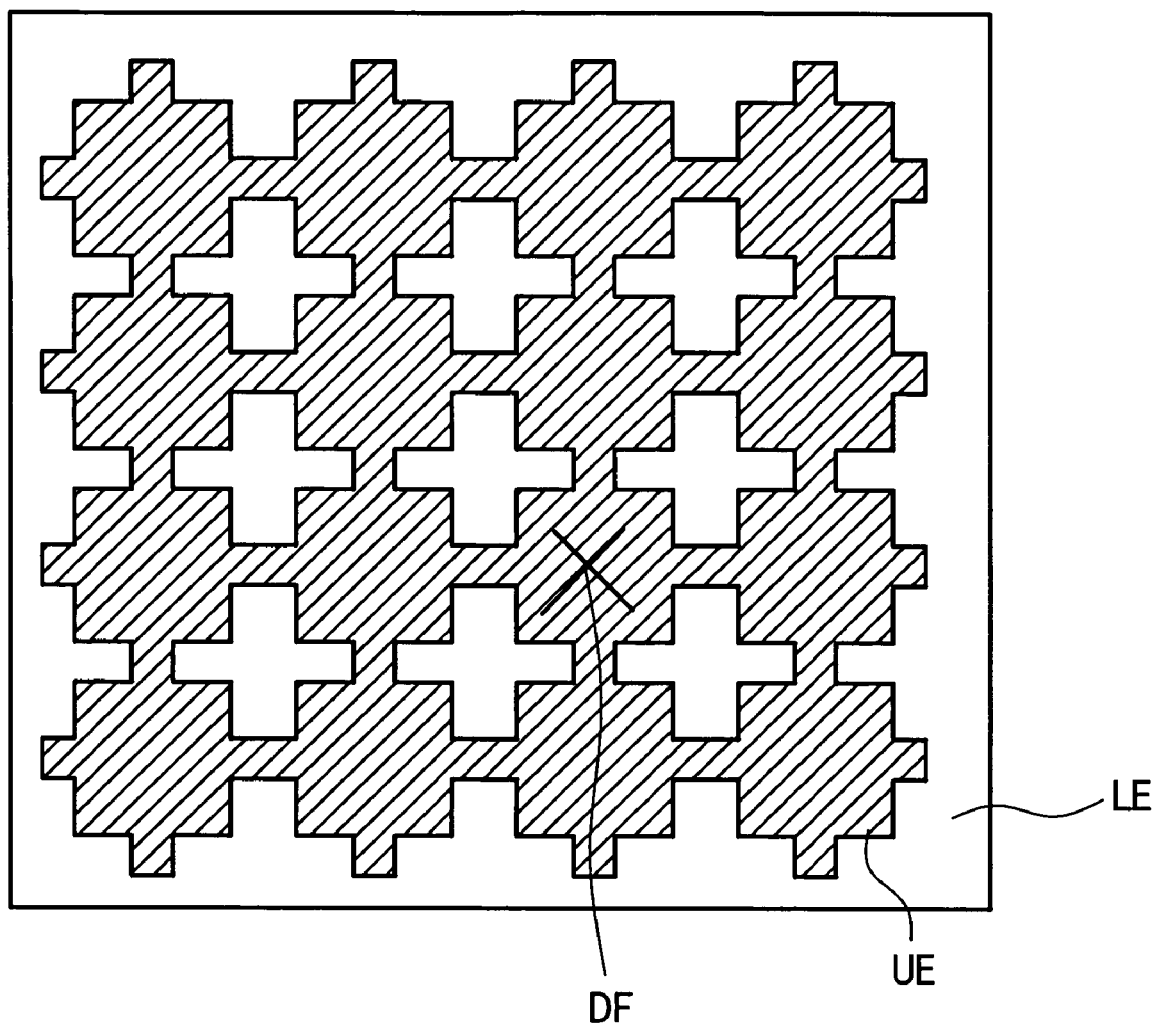
FIG. 5 is an explanatory view showing a method of repairing the illumination device according to the present invention and also is a view showing a portion where an upper electrode and a lower electrode are short-circuited.

In the backlight BL having such a constitution, assume that, as shown in FIG. 5, a pin hole is generated in a portion of the light emitting layer EL and short-circuiting arises between the lower electrode LE and the upper electrode UE at the portion (indicated by a x mark DF in FIG. 5).

In this case, the lower electrode LE and the upper electrode UE have the same potential and hence, the whole light emitting layer EL stops emitting of light whereby the constitution does not function as the backlight BL at all.

Figure 6:
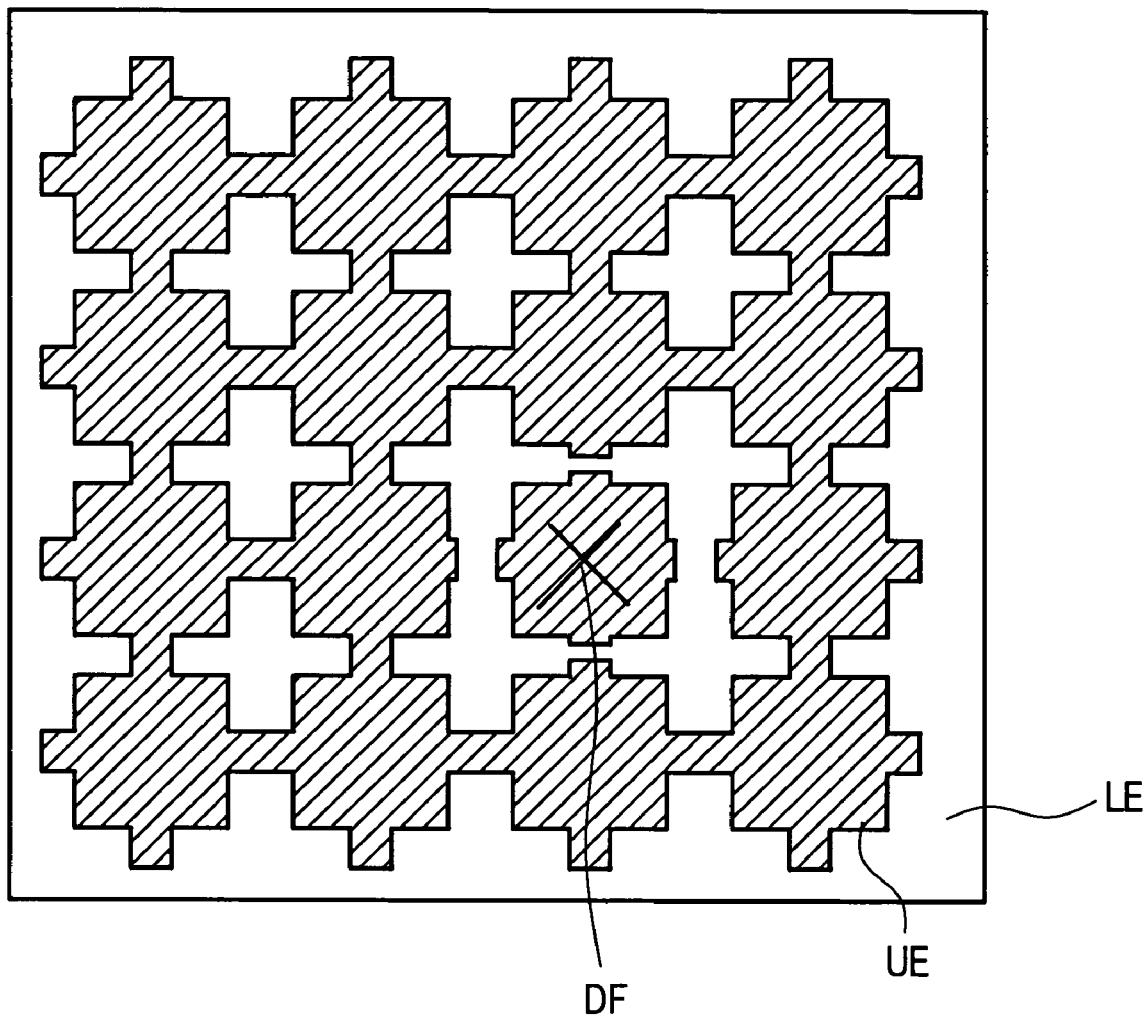
FIG. 6 is an explanatory view showing a method of repairing the illumination device according to the present invention and also is a view showing a state that an upper electrode of a portion at the short-circuited portion is electrically isolated from an upper electrode of other portions.

Accordingly, as means for repairing such a situation, as shown in FIG. 6, joint portions which connect the upper electrode UE of the partitioned region PA which includes the portion where the short-circuiting is generated in the inside of the region and the upper electrode UE of other respective partitioned regions PA arranged close to the above-mentioned partitioned region PA in the upper and lower directions as well as in the left and right directions are cut by scanning of laser beams, for example.

In such a case, the upper electrode UE which has the same potential as the lower electrode LE is limited only to the upper electrode UE on the partitioned region PA where the above-mentioned short-circuiting arises and such an upper electrode UE is electrically isolated from other upper electrodes UE.

Accordingly, although the emission of light is damaged with respect to the light emitting layer EL of the partitioned region PA where the short-circuiting arises, the light emitting layer EL of all other partitioned regions PA except for the short-circuited partitioned region PA can emit light and hence, the backlight BL is repaired.

In view of the above, it is preferable that the size of the above-mentioned each partitioned region PA may be set to a level such that even when the emission of light of the light emitting layer EL of the region corresponding to one partitioned region PA is isolated and damaged, the light emitting function is not damaged with respect to the light emitting regions of the backlight BL as a whole.

Further, as can be clearly understood from the above-mentioned repairing steps, when a portion where a pin hole is liable to be easily generated in the light emitting layer EL, for example, is definite, that is, when a portion where the probability that the pin hole is generated in the light emitting layer is definite, by setting a pattern of the upper electrode UE such that the partitioned regions PA having such a portion are made small and the partitioned regions PA except for such a partitioned regions PA are made large, it is possible to increase the light emitting efficiency of the light emitting layer EL.

Figure 7:
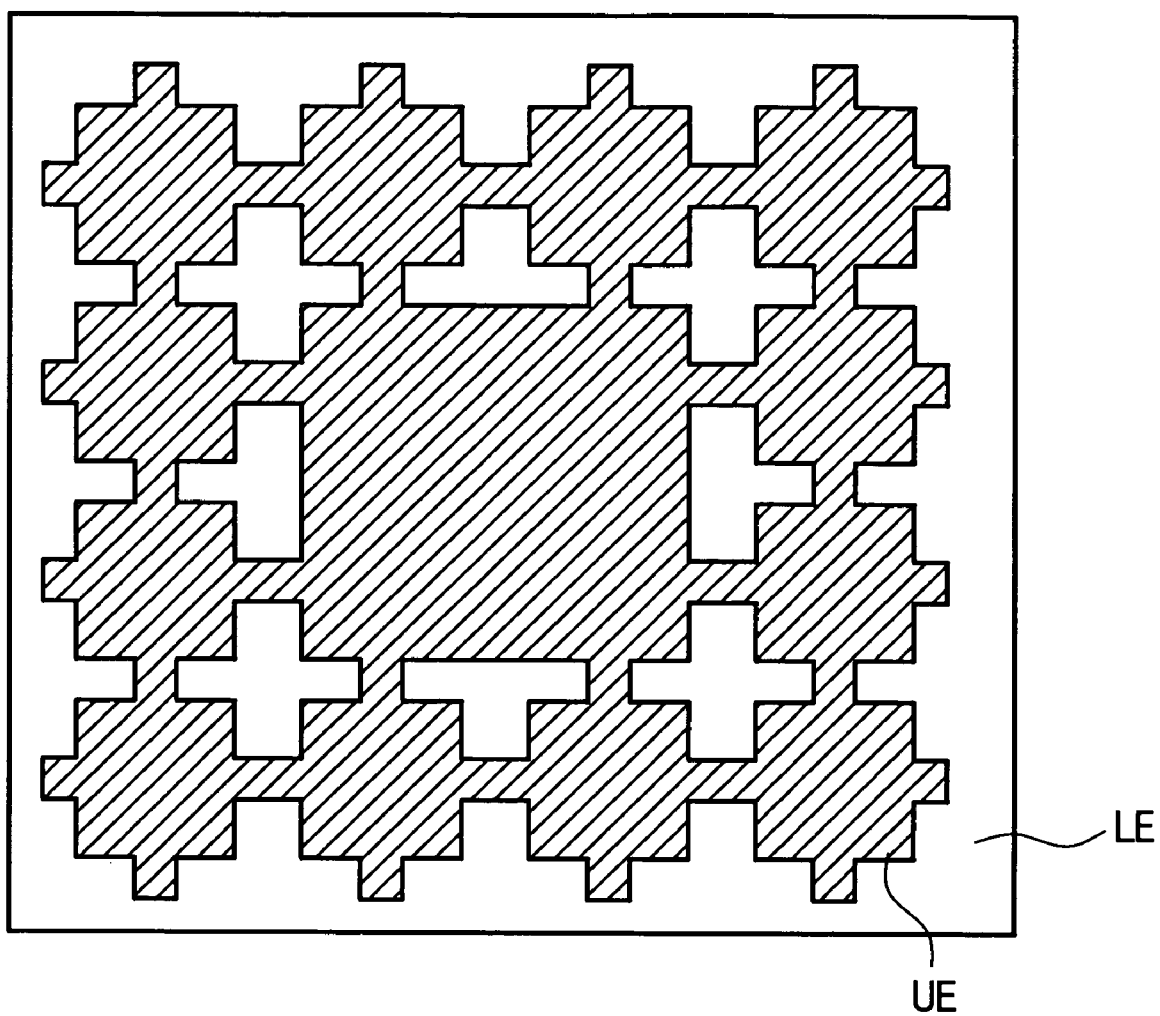
FIG. 7 is a plan view showing another embodiment of the constitution of the illumination device according to the present invention.

FIG. 7 shows such a constitution and corresponds to FIG. 1. For example, in the whole region of the light emitting layer EL, when the probability that the pin hole is generated is high in a periphery of the light emitting layer EL, an area of the respective partitioned region PA in the periphery is made small and an area of the partitioned region PA at the center except for the periphery is made large. Since the partitioned region PA at the center is not further divided into small partitioned regions, the partitioned region at the center has no gaps which are generated by forming separate portions whereby it is possible to allow the regions corresponding to the gaps to contribute to the emission of light.

In the embodiment shown in FIG. 7, there are provided two divided regions from the center to the periphery of the light emitting layer EL, and an area of the partitioned region PA in the respective divided regions is made different from each other between the center and the periphery of the light emitting layer EL. However, this embodiment is not limited to such a constitution. That is, it is needless to say that two or more divided regions are provided from the center to the radially extending peripheral portion of the light emitting layer EL and area of the partitioned regions PA in these respective divided regions may be gradually reduced from the center to the periphery of the light emitting layer EL.

Further, it is needless to say that the size of the area of the partitioned region PA is made small at the center of the light emitting layer EL and is made large at the periphery of the light emitting layer EL. This constitution is effective when the probability that a pin hole is generated at the center of the light emitting layer EL is high.

Figure 8:
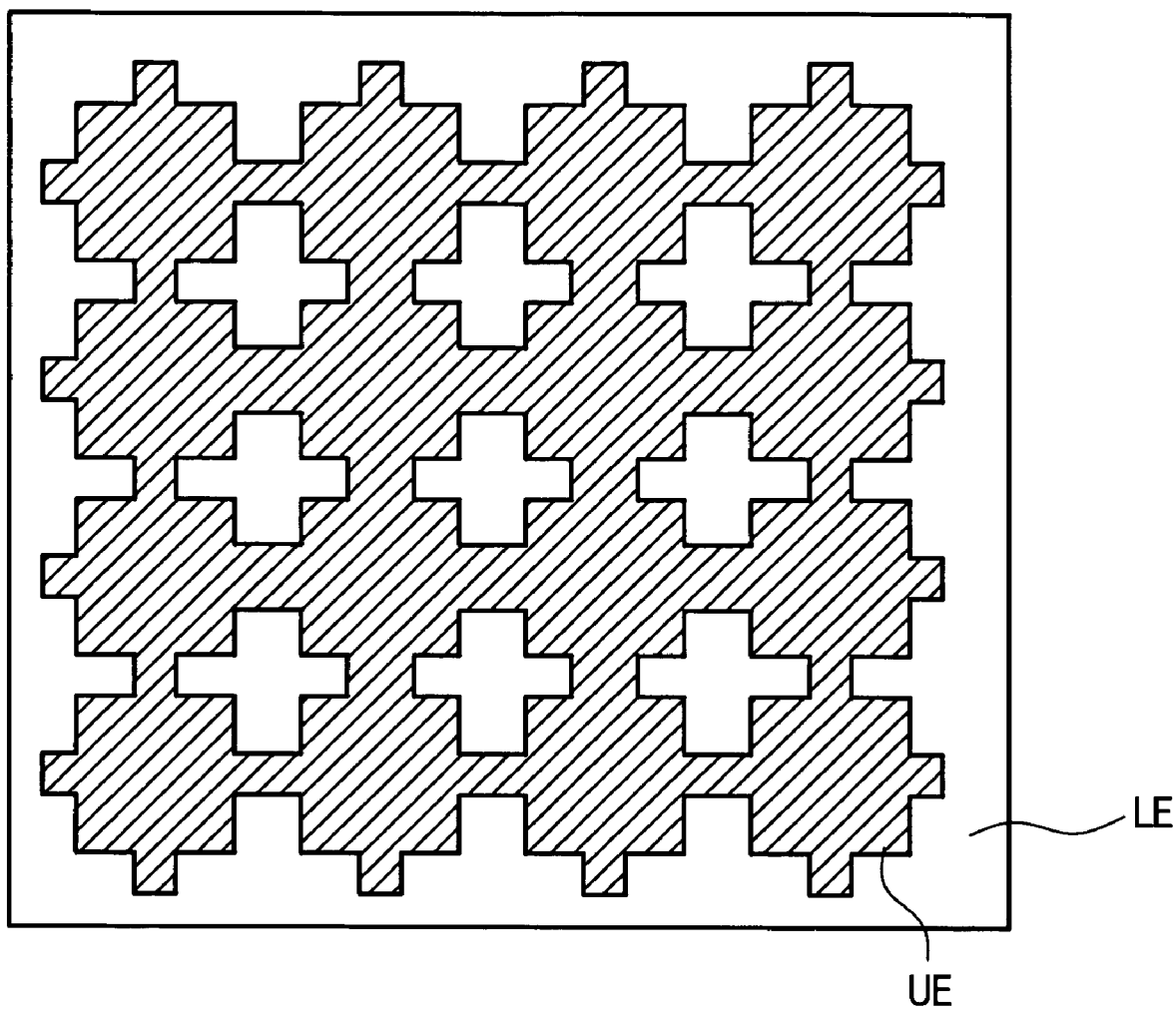
FIG. 8 is a plan view showing another embodiment of the constitution of the illumination device according to the present invention.

FIG. 8 is a view which is depicted corresponding to FIG. 1. FIG. 8 indicates that a width of the upper electrode UE above the connecting region JA which connects the neighboring respective partitioned regions PA is not specifically limited and may be arbitrarily determined at portions where the connecting regions JA are formed. In FIG. 8, the width of the upper electrode UE on the connecting regions JA at the center except for the periphery is made large and the width of the upper electrode UE on the connecting regions JA at the periphery is made small. Further, it is needless to say that the width of the upper electrode UE is not limited to the above-mentioned setting and may be set oppositely.

Figure 9:
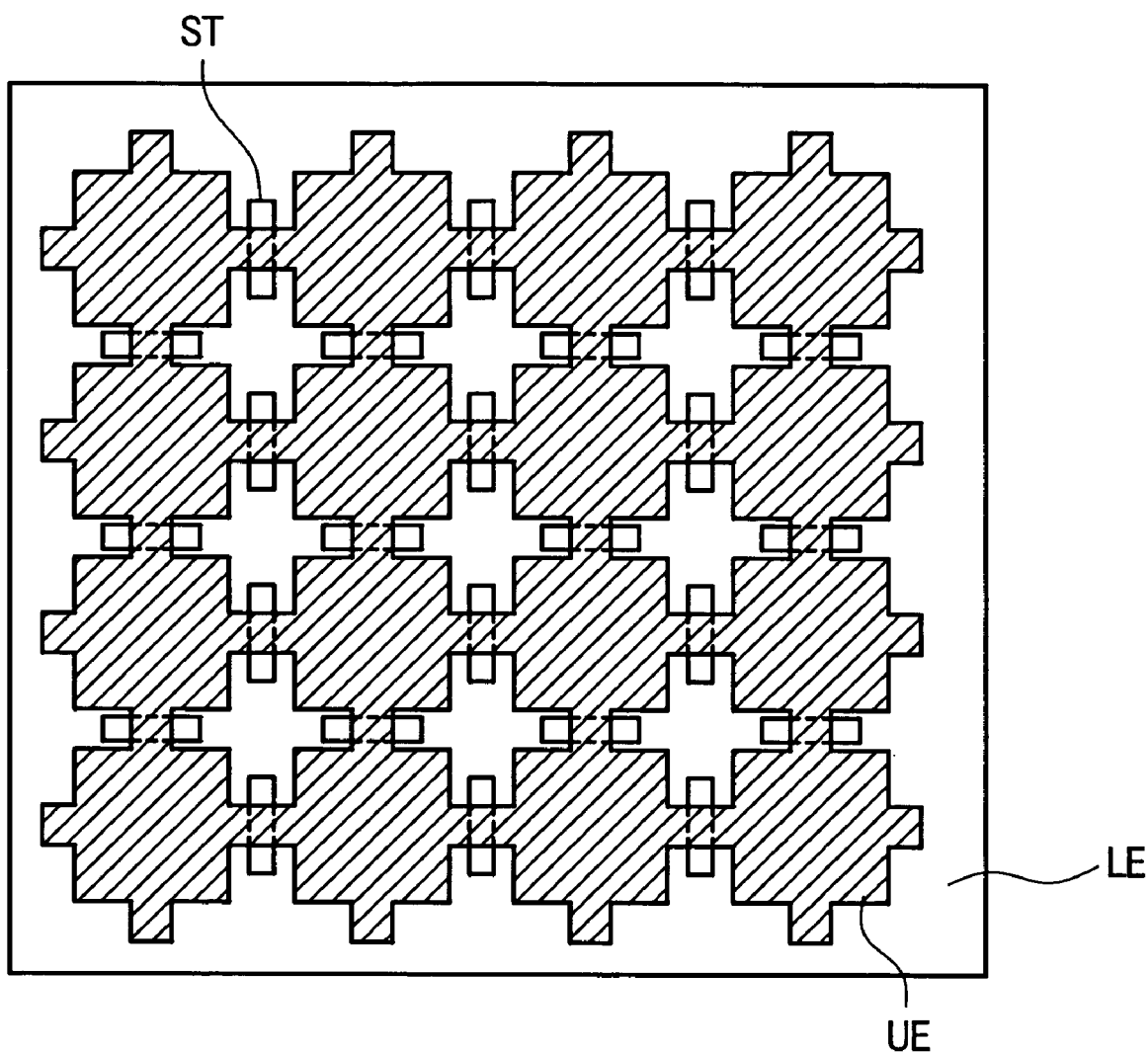
FIG. 9 is a plan view showing another embodiment of the constitution of the illumination device according to the present invention.

FIG. 9 is a view which shows the constitution in which slits ST are formed in the lower electrode LE in a state that the slits ST intersect the upper electrode UE on the connecting regions JA which connect the respective partitioned regions PA.

As described above, when the upper electrode UE on the connecting region JA which connects the respective partitioned regions PA is cut by scanning the laser beams in the repairing operation, by preventing the formation of the lower electrode LE at a portion corresponding to a scanning path range of the laser beams by the above-mentioned slit ST, the cutting operation is facilitated.

Figure 10:
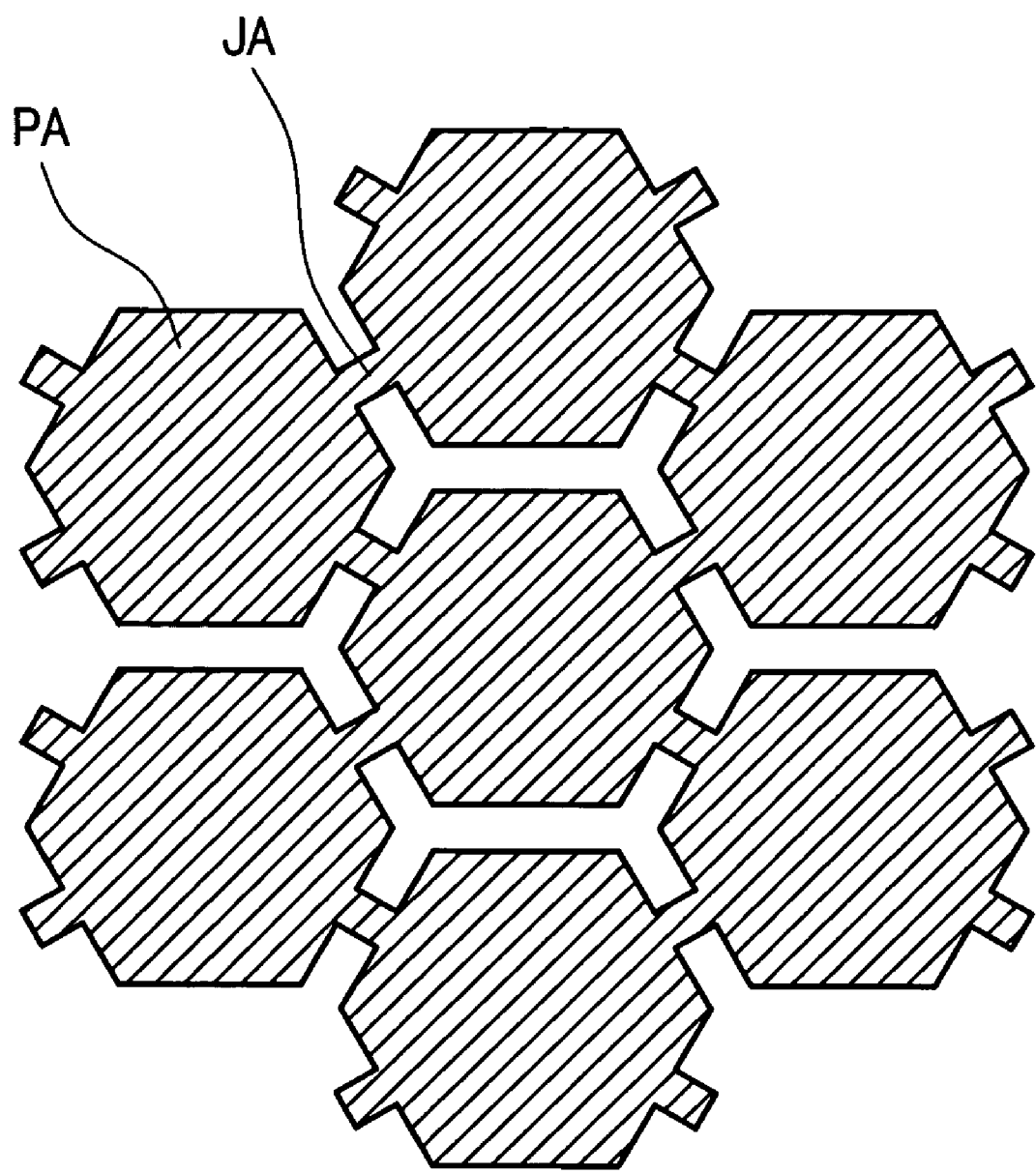
FIG. 10 is a plan view showing another embodiment of the constitution of one electrode of the illumination device according to the present invention.

The above-mentioned embodiments adopt the quadrangular shape as the shape of the respective partitioned regions PA. However, it is needless to say that the shape of the respective partitioned regions PA is not limited to such a shape and other shapes may be adopted. For example, FIG. 10 shows that the partitioned regions PA have a hexagonal shape.

Also in this case, the connecting region JA which connects the neighboring partitioned regions PA has a width smaller than a length of one side of each partitioned region PA.

Here, the respective partitioned regions PA are formed in a polygonal shape to decrease a gap defined between one partitioned region PA and another partitioned region PA which is arranged close to one partitioned region PA as much as possible. However, when the number of corners of the polygonal shape is increased and the polygonal shape finally approximates a circle or a shape close to the circle, the side of the above-mentioned polygonal shape may correspond to the diameter of the circle. That is, when the partitioned regions PA are formed in a circle, it is possible to obtain the similar advantageous effects by setting the width of the connecting region JA between the partitioned region PA and another partitioned region PA smaller than the diameter of the circle.

In the above-mentioned embodiments, the pattern of electrode which is effectively applicable to the repairing of the short-circuiting is applied to the upper electrode UE. However, the application of the pattern is not limited to the upper electrode UE and the pattern is applicable to the lower electrode LE to obtain the similar advantageous effects.

Further, it is needless to say that it is possible to obtain the similar advantageous effects by applying the above-mentioned electrode pattern to both of the upper electrode UE and the lower electrode LE.

Here, the above-mentioned backlight BL has been explained with respect to the case in which the backlight BL is used for the liquid crystal display device. However, it is needless to say that the constitution of the above-mentioned backlight BL is applicable to the case in which the backlight BL is used as an independent light source in a form of a surface light source. In this case, it is possible to use the backlight as various kinds of illumination devices.

The above-mentioned respective embodiments may be used independently or in combination. This is because that the advantageous effects of the respective embodiments can be obtained independently or synergistically.

What is claimed is:

1. A liquid crystal display device comprising:
a liquid crystal display panel and a backlight;
wherein the backlight is formed by stacking a lower electrode, a light emitting layer and an upper layer on one surface of a substrate,
at least one of the lower electrode and the upper electrode defines a pattern which is formed on respective partitioned regions which are formed by dividing a region on the substrate into a plurality of spaced-apart and divided partitioned regions and connecting regions which connect each partitioned region and the neighboring other partitioned regions which are arranged close to each partitioned region, and
a width of the electrode on the connecting regions is set smaller than a length of one side or a diameter of the electrode on the partitioned region.

2. A liquid crystal display device according to claim 1, wherein another electrode out of the lower electrode and the upper electrode defines a planar pattern which is overlapped to one electrode.

3. A liquid crystal display device according to claim 1, wherein the light emitting layer per se exhibits a white light and is formed also on regions other than the respective partitioned regions and the connecting regions.

4. A liquid crystal display device according to claim 1, wherein the light emitting layer is formed by arranging respective layers which respectively exhibit red, green and blue close to each other and are formed in at least the respective partitioned regions.

5. An illumination device being characterized in that
the illumination device is formed by stacking a lower electrode, a light emitting layer and an upper layer on one surface of the substrate,
at least one of the lower electrode and the upper electrode is formed on respective partitioned regions which are formed by dividing a region on the substrate into a plurality of spaced-apart and divided partitioned regions and connecting regions which connect each partitioned region and the neighboring other partitioned regions which are arranged close to each partitioned region, and
a width of the electrode on the connecting regions is set smaller than a length of one side or a diameter of the electrode on the partitioned region.

6. An illumination device according to claim 5, wherein another electrode out of the lower electrode and the upper electrode defines a planar pattern which is overlapped to one electrode.

7. An illumination device according to claim 5, wherein the light emitting layer per se exhibits a white light and is formed also on regions other than the respective partitioned regions and the connecting regions.

8. An illumination device according to claim 5, wherein the light emitting layer is formed by arranging respective layers which respectively exhibit red, green and blue close to each other and are formed in at least the respective partitioned regions.

9. A liquid crystal display device comprising:
a liquid crystal display panel and a backlight;
wherein the backlight is formed by stacking a lower electrode, a light emitting layer and an upper layer on one surface of a substrate,
one of the lower electrode and the upper electrode have planer pattern,
another of the lower electrode and the upper electrode have plurality of large regions and plurality of small regions which connect neighboring two of the plurality of large regions,
and width of the small regions is narrower than that of the large regions.

10. A liquid crystal display device according to claim 9, wherein both the plurality of large regions and the plurality of small regions are overlapped to the one the lower electrode and the upper electrode.

11. A liquid crystal display device according to claim 10, wherein the light emitting layer per se exhibits a white light and formed at the large regions, the small regions, and region between the large regions.

12. A liquid crystal display device according to claim 10, wherein the light emitting layer is formed by arranging respective layers which respectively exhibit red, green and blue close to each other and are formed in at least the respective large regions.

13. A liquid crystal display device according to claim 10, wherein the small region have bar shape.

14. A liquid crystal display device according to claim 13, wherein the large region have square shape.

15. A liquid crystal display device according to claim 13, wherein the large region have hexagonal shape.

16. A liquid crystal display device according to claim 14, wherein the small region are arranged at plurality side of the large region.

17. A liquid crystal display device according to claim 15, wherein the small region are arranged at plurality side of the large region.

18. A liquid crystal display device according to claim 13, wherein the large region have first large region and plurality of second large region which arranged around the first large region.

19. A liquid crystal display device according to claim 13, wherein the one of the lower electrode and the upper electrode have slit arranged to cross the small region.

20. An illumination device being characterized in that
the illumination device is formed by stacking a lower electrode, a light emitting layer and an upper layer on one surface of a substrate,
one of the lower electrode and the upper electrode have planer pattern,
another of the lower electrode and the upper electrode have plurality of large regions and plurality of small regions which connect neighboring two of the plurality of large regions,
and width of the small regions is narrower than that of the large regions.

21. An illumination device according to claim 20, wherein both the plurality of large regions and the plurality of small regions are overlapped to the one the lower electrode and the upper electrode.

22. An illumination device according to claim 20, wherein the light emitting layer per se exhibits a white light and formed at the large regions, the small regions, and region between the large regions.

23. An illumination device according to claim 20, wherein the light emitting layer is formed by arranging respective layers which respectively exhibit red, green and blue close to each other and are formed in at least the respective large regions.

24. An illumination device according to claim 20, wherein the small region have bar shape.

25. An illumination device according to claim 24, wherein the large region have square shape.

26. An illumination device according to claim 24, wherein the large region have hexagonal shape.

27. An illumination device according to claim 25, wherein the small region are arranged at plurality side of the large region.

28. An illumination device according to claim 26, wherein the small region are arranged at plurality side of the large region.

29. An illumination device according to claim 24, wherein the large region have first large region and plurality of second large region which arranged around the first large region.

30. An illumination device according to claim 24, wherein the one of the lower electrode and the upper electrode have slit arranged to cross the small region.

* * * * *